United States Patent
Hollabaugh et al.

(10) Patent No.: US 10,469,044 B1
(45) Date of Patent: Nov. 5, 2019

(54) POWER MITIGATION FOR LOUDSPEAKER AMPLIFIERS

(71) Applicant: Apple Inc., Cupertino, CA (US)

(72) Inventors: James M. Hollabaugh, San Jose, CA (US); Hannes Breitschaedel, Cupertino, CA (US); David A. Sumberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/850,921

(22) Filed: Dec. 21, 2017

(51) Int. Cl.
- H04R 3/00 (2006.01)
- H03G 3/00 (2006.01)
- H04R 1/22 (2006.01)
- H03F 3/20 (2006.01)

(52) U.S. Cl.
CPC ............ *H03G 3/001* (2013.01); *H03F 3/20* (2013.01); *H04R 1/22* (2013.01); *H04R 3/007* (2013.01)

(58) Field of Classification Search
CPC .. H03G 3/001; H03F 3/20; H04R 1/22; H04R 3/007
See application file for complete search history.

(56) References Cited

U.S. PATENT DOCUMENTS

| | | | |
|---|---|---|---|
| 5,528,695 A | 6/1996 | Klippel | |
| 5,577,126 A | 11/1996 | Klippel | |
| 2002/0076067 A1* | 6/2002 | Caldwell | H03F 1/0211 381/110 |
| 2010/0215193 A1* | 8/2010 | Wihardja | H03G 5/005 381/103 |
| 2011/0228945 A1* | 9/2011 | Mihelich | H04R 3/002 381/59 |
| 2012/0177226 A1* | 7/2012 | Silverstein | G06F 1/3212 381/107 |
| 2013/0022208 A1 | 1/2013 | Dhuyvetter | |
| 2013/0083928 A1 | 4/2013 | Williams et al. | |
| 2013/0329894 A1 | 12/2013 | Krishnaswamy et al. | |
| 2013/0329898 A1 | 12/2013 | Williams et al. | |
| 2015/0349737 A1* | 12/2015 | Svendsen | H03F 1/0227 455/84 |
| 2016/0249135 A1 | 8/2016 | Savvopoulos et al. | |
| 2017/0220087 A1 | 8/2017 | Hijazi et al. | |

* cited by examiner

*Primary Examiner* — James K Mooney
(74) *Attorney, Agent, or Firm* — Womble Bond Dickinson (US) LLP

(57) ABSTRACT

A power mitigation algorithm in a loudspeaker amplification system that includes a loudspeaker driver, an audio amplifier, and a constant output power, power supply. A power requirement for the amplifier to output an audio signal is determined. A gain adjustment signal is then determined based on a difference between the power requirement and a power budget of the amplifier. Gain of the audio signal is adjusted according to the gain adjustment signal, for output through the loudspeaker driver. As a result, a peak level of the power consumption of the amplifier while outputting the gain-adjusted audio signal becomes less than the power budget. Other embodiments are also described and claimed.

22 Claims, 5 Drawing Sheets

US 10,469,044 B1

POWER MITIGATION FOR LOUDSPEAKER AMPLIFIERS

FIELD

An aspect of the disclosure relates to a digital processor performing a power mitigation algorithm upon an audio signal that is being output by a loudspeaker driver, to detect the power requirements that exceed a power budget of an audio amplifier that is driving the loudspeaker driver with the audio signal. Other aspects are also described.

BACKGROUND

A regulated power supply is an electronic component that supplies electrical energy to an electrical load. Normally, most power supplies regulate either their output voltage or output current to remain at a preset, constant level, despite variations in the load.

In the case of a typical audio amplification system, an audio amplifier uses the electrical energy from a voltage regulated DC power supply to amplify an audio signal to drive a loudspeaker driver, where the amplifier and the driver are together acting as the load. If, however, the electrical power required by the audio amplifier to amplify the audio signal exceeds the power available from the power supply, performance by the loudspeaker driver may suffer. For example, when the amplifier attempts to overdraw the power supply during a peak excursion of an audio signal, such as a large bass hit, the regulated DC voltage drops thereby causing loudspeaker performance to suffer. A local energy storage device such as a capacitor may be added to the output of the power supply, to assist with meeting such peak power demands.

SUMMARY

Systems, methods, and articles of manufacture are provided for a digital processor that performs a power mitigation algorithm upon an audio signal that is being output by a loudspeaker driver, where the processor detects the power requirements that exceed a power budget of an audio amplifier that is driving the loudspeaker driver with the audio signal.

An aspect of the disclosure is a loudspeaker amplification system that mitigates its peak power requirements during playback of audio content, to stay within a "power budget" and as a result avoids overloading its constant output power, power supply. This enables the constant output power rating to be substantially less than the peak power levels expected of its load, and the power supply circuit can therefore be made physically smaller while still being able to output content such as music that exhibits relatively high power peaks as compared to the average power level, at an acceptable quality. The power budget may be defined as the amount of power that is available for the audio amplifier to drive its loudspeaker driver to output the audio content. Specifically, the power budget may be the difference between a constant output power rating of the power supply and the total power required by all elements within the system that are part of the load except for the particular audio amplifier that is excepted to exhibit high power peaks during playback. For example, the load may include a system logic board, light emitting diodes (LEDs) or a display screen, several audio amplifiers such as tweeter amplifiers that do not exhibit the high power peaks that are of concern, in addition to at least one audio amplifier such as a woofer amplifier that is expected to have high power peak demands.

One aspect of the disclosure is a method for performing a power mitigation algorithm that avoids overdrawing power from a constant output power, power supply. This process is also referred to here as a dynamic peak power mitigation process. The method may be performed by a digital signal processor, which receives a digital audio signal that is to drive a loudspeaker transducer or driver (e.g., a woofer). The processor calculates power needed by an audio amplifier (power requirement) while driving the woofer to output the audio signal during a given time interval or window. Specifically, the determined power requirement is that which the audio amplifier is expected to draw from the power supply, in order to amplify the audio signal during the given time interval or window. This power may exceed the constant output power rating of the power supply. Accordingly, a gain adjustment signal is determined that is based on or includes a difference between the determined power requirement and a power budget of the audio amplifier. Using the gain adjustment signal, gain (magnitude or amplitude) of the audio signal is then adjusted to produce a gain-adjusted audio signal. Since the gain adjustment is based on the available power from the power supply (according to the power budget), the audio amplifier amplifies the adjusted audio signal without overdrawing the power supply. Any peaks in the audio signal that would have resulted in exceeding the power budget (also referred to here as high power peaks) are thus automatically reduced in the gain-adjusted audio signal (which is outputted through the loudspeaker driver.)

In one aspect, the gain adjustment signal is determined based on "moving" averages of instantaneous power (needed for the woofer to output the audio signal), determined over several moving or sliding time intervals or windows, of different sizes. Several average instantaneous power requirements are computed, each average being an average of the instantaneous power requirement values computed in a respective window. For each of the windows, a difference between the average in that window and the power budget is computed. The gain adjustment signal is then determined, according to the largest difference. In other words, the resulting gain adjustment that is applied to the audio signal may be in proportion to the largest difference, and not any other differences computed for other windows. The gain adjustment signal may for example be in the range of 0 dB to some maximum attenuation value that is available (e.g., a most negative dB value.) The system thus attenuates the audio signal as needed to ensure that the power drawn by the audio amplifier stays within its power budget. The above process to update the gain adjustment signal then repeats, for a new window position (the windows slide or move to another time interval of the audio signal, hence the reference here to "moving averages".)

In one aspect, instead of having a single or fixed power budget for all of the different-sized windows, a separate power budget is determined for each window.

In another aspect, the power budget that is used to determine the gain adjustment signal for a woofer input signal may be smaller due to the power that is drawn by additional audio amplifiers (driving additional loudspeakers), from the same constant output power, power supply. The additional loudspeakers may be higher frequency loudspeakers, e.g., tweeters, as opposed to a lower frequency loudspeaker referred to here as a woofer. In this aspect, the system calculates an instantaneous power requirement (e.g., one sample) for each of several, tweeter audio signals, and combines (e.g., sums or adds) these calculated instantaneous power requirements, for all of the tweeters, into a single, total power requirement. Finally, the power budget for the woofer is computed as a difference between 1) the constant output power rating of the power supply and 2) the total power requirement for driving the tweeters.

In one aspect, the system calculates the total power requirement for the tweeter amplifiers as follows. For each window (of several samples of the tweeter signals), several instantaneous, total power requirement values (one for each sample within a given window) are computed. These instantaneous, total power requirement values are then averaged, resulting in a single, average total power requirement for each window (average power required to drive all of the additional loudspeakers to output the tweeter audio signals, in the given window.) Note that each window may be different (covers a different time interval, of the tweeter audio signals) but all of the windows may overlap each other.

Another aspect of the disclosure is a time domain-based digital signal processing technique, which calculates the instantaneous power requirement for an audio amplifier that is driving a loudspeaker driver, e.g., a woofer. A loudspeaker driver admittance filter is defined, as a digital filter, which represents the input admittance of the loudspeaker driver. The filter is applied to transform an audio driver input signal that is in voltage domain (as a discrete-time sequence of driver input voltage samples, or instantaneous voltage values) into an audio driver instantaneous current, and the latter is multiplied by the audio driver input signal (in voltage domain) to obtain instantaneous, driver input power values (pursuant to the relation power=voltage*current.)

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The aspects of the invention are illustrated by way of example and not by way of limitation in the figures of the accompanying drawings in which like references indicate similar elements. It should be noted that references to "an" or "one" aspect of the invention in this disclosure are not necessarily to the same aspect, and they mean at least one. Also, in the interest of conciseness and reducing the total number of figures, a given figure may be used to illustrate the features of more than one aspect of the invention, and not all elements in the figure may be required for a given aspect.

DETAILED DESCRIPTION

Several aspects of the invention with reference to the appended drawings are now explained. Whenever the shapes, relative positions and other aspects of the parts described in the aspects are not explicitly defined, the scope of the invention is not limited only to the parts shown, which are meant merely for the purpose of illustration. Also, while numerous details are set forth, it is understood that some aspects of the invention may be practiced without these details. In other instances, well-known circuits, structures, and techniques have not been shown in detail so as not to obscure the understanding of this description.

Some conventional audio amplifier designs require that the power supply output power rating be at least as high as the peak power demands of the audio content (e.g., music) that is expected to be played through the loudspeakers. This means that the power supply is effectively "over designed", to have a rating equal to or greater than the peak power levels that may be drawn by the load during for example music playback. Such over-designed power supply circuits tend to be quite large (e.g., because larger components, such as electrolytic capacitors are required.) Smaller and more compact loudspeaker amplification systems (e.g., consumer electronics, smart or intelligent speakers) cannot take advantage of such an easy solution, because of their limited internal space.

Figure 1:
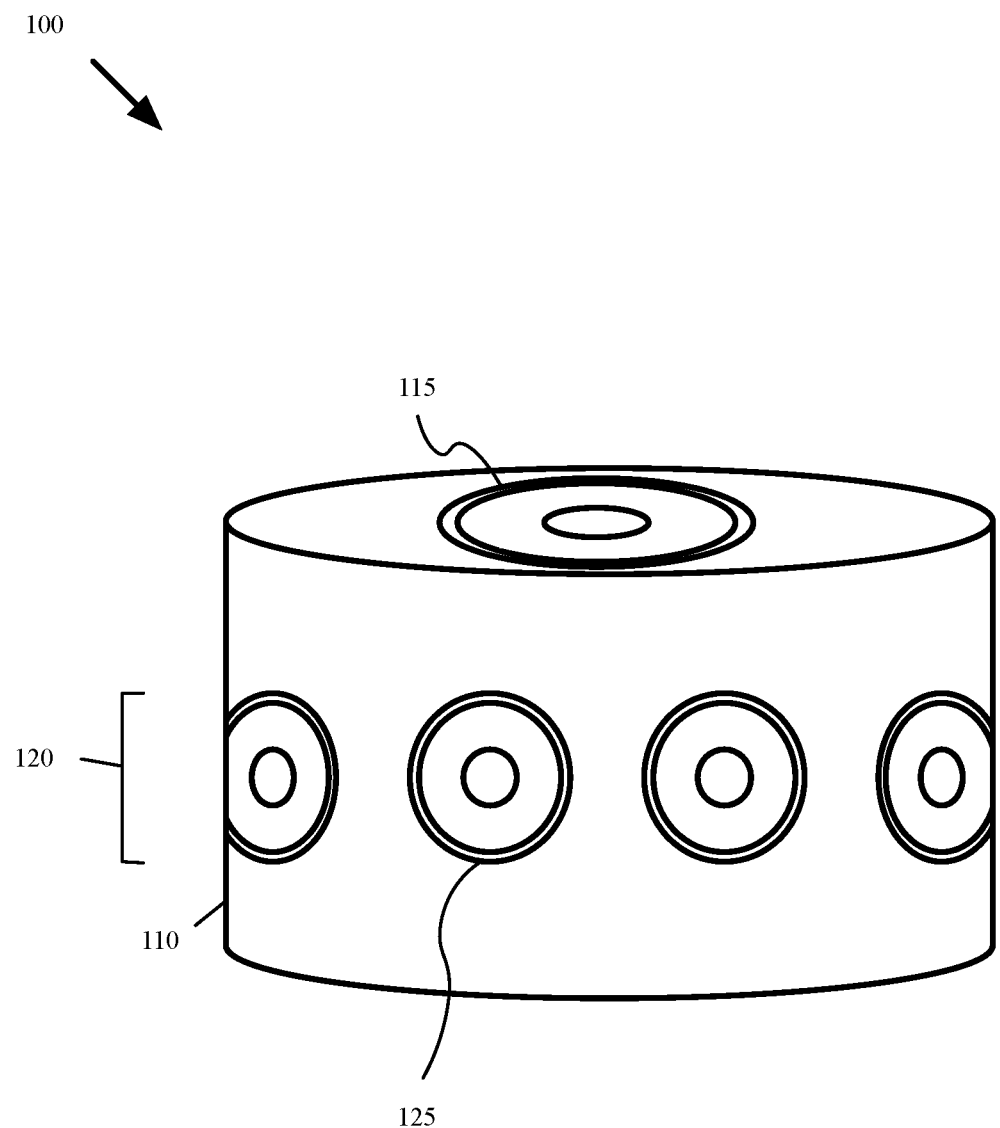
FIG. 1 shows an audio amplification system housed inside a cylindrical loudspeaker cabinet that includes several loudspeakers.

FIG. 1 shows a loudspeaker amplification system 100 that includes a generally cylindrical shaped loudspeaker cabinet 110 that has integrated therein a loudspeaker array 120 with individual loudspeaker drivers 125 (or loudspeaker transducers) that are arranged side by side and circumferentially around a center vertical axis of the cabinet 110. The cabinet 110 also has integrated therein a separate loudspeaker driver 115 that is positioned at a top of the loudspeaker cabinet 110. In other aspects, however, the separate loudspeaker driver 115 may be positioned at other locations (e.g., at the bottom or at the side of the cabinet 110.) In one aspect, as will be later described, functions, such as digital signal processing and in particular a power mitigation algorithm, may be performed by circuit components (or elements) within the loudspeaker cabinet 110. In another aspect, these functions may be performed by electronic components outside the loudspeaker cabinet 110, such as a separate audio receiver, not shown, that produces the loudspeaker driver input signals in digital form which are then wirelessly transmitted to the loudspeaker cabinet. The loudspeaker cabinet may communicate, via either wired or wireless means, with the audio receiver. In the example shown, however, a portion or all of the electronic hardware components, sometimes found within an audio receiver (e.g., a rendering processor), are integrated in the enclosure of the loudspeaker cabinet 110. In one aspect, the loudspeaker cabinet 110 may be part of a home audio system or an audio system in a vehicle.

The loudspeaker drivers 125, 115 may be electrodynamic drivers, and may include some that are specifically designed for outputting sound (or their output response is greatest at) certain, different frequency bands. For example, driver 115 may be designed to operate better, more efficiently, or with greatest response in a low frequency band that is lower than the operating frequency range of certain other drivers. Such low frequency drivers may be generically referred to here as woofers. There may also be drivers 125 included within the loudspeaker array 120 that are designed to operate better or more efficiently or have greatest response in a high frequency band (that is higher than the operating frequency range of certain other drivers, and higher than the low frequency band) and may be generically referred to here as tweeters. In one aspect, the drivers 125 may be "full-range" loudspeaker drivers that reproduce as much of the audible frequency range as possible given the physical volume (physical space) constraints on the driver, except perhaps for very low frequencies, e.g., below 100 Hz. The loudspeaker drivers 125 are driven with full-range audio driver signals that may also contain audio in the low frequency band that is preferred by the driver 115.

Figure 2:
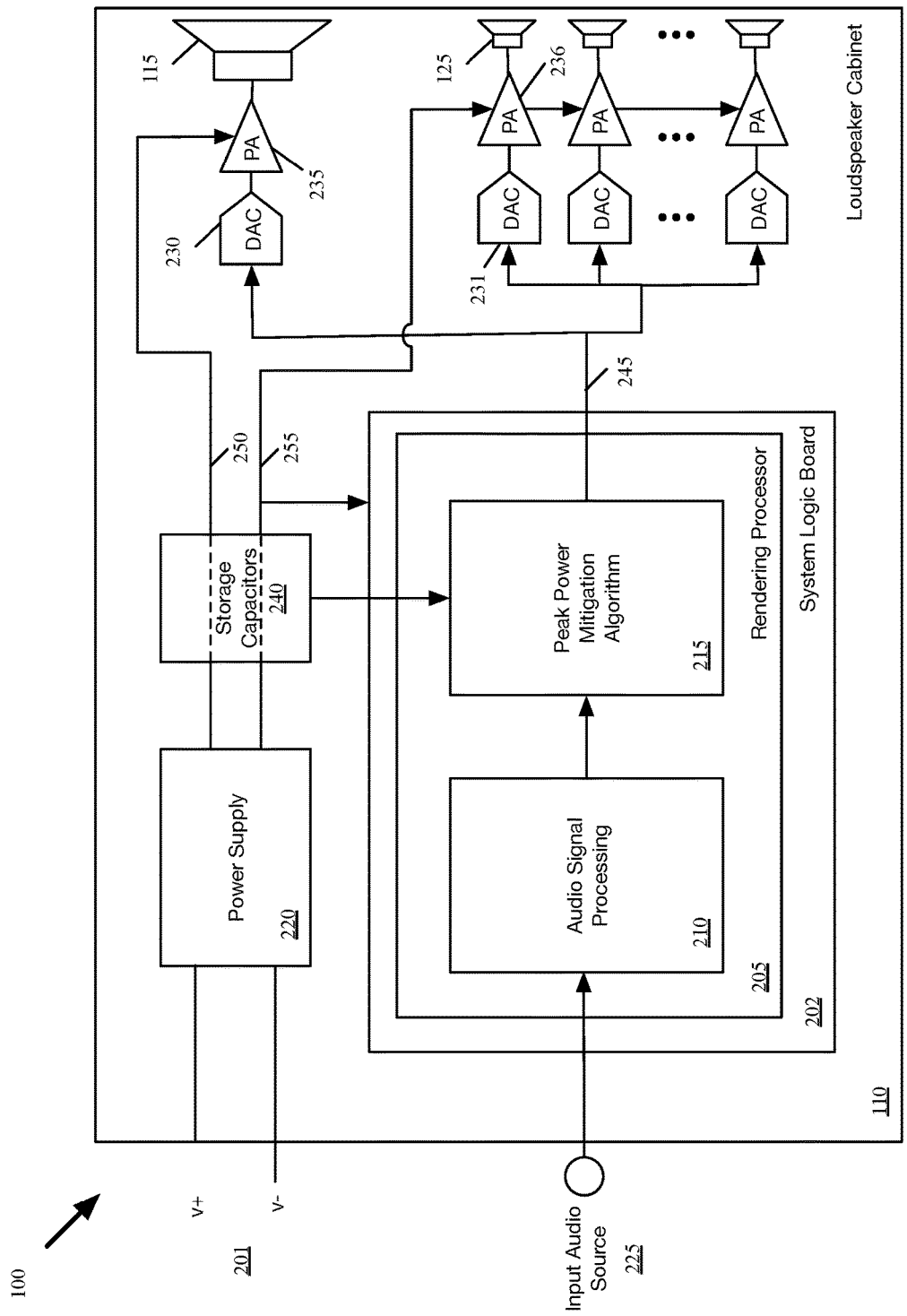
FIG. 2 shows a block diagram of an audio amplification system with a rendering processor that is executing a peak power mitigation algorithm of one aspect of the invention.

FIG. 2 shows a block diagram of the loudspeaker amplification system 100 including the loudspeaker cabinet 110, an input audio source 225, and an AC mains input 201. The loudspeaker cabinet 110 in this aspect also includes a system logic board 202 with a rendering processor 205, a power supply 220, storage capacitors 240, digital to analog converters (DAC) 230 and 231, low range audio power amplifiers 235 and full range audio power amplifiers 236. The term "low range" may refer to a frequency range that is typically preferred by a woofer. The term "full range" may refer to an audio frequency range that is wider than the low frequency range and such as one that is typically preferred by a midrange or tweeter. Note however that the concepts described here are not limited to the combination of a low range audio amplification and output path and a full range audio amplification and output path, as instead they may be applied to for example a system having a single audio amplification and output path, e.g., a single low range path, or to a system having both a low range path and high range path where the term "high range" in that case may refer to an audio frequency band that is above the low range.

As described in connection with FIG. 1, the loudspeaker cabinet in this aspect also includes the array 120 of additional loudspeaker drivers 125, along with the separate loudspeaker driver 115. In this example, the amplifier 235 has an output coupled to drive a signal input of loudspeaker driver 115; and each of the full range audio power amplifiers 236 has an output coupled to drive a signal input of a respective loudspeaker driver 125. Each amplifier 235 and 236 receives an analog input from a respective digital to analog converter (DAC) (e.g., amplifier 235 receives its analog input from DAC 230, while each amplifier 236 receives an analog input from a respective DAC 231), where each DAC 230 and 231 receives a separate, input digital audio signal through a communications link 245. Although the DACs 230 and 231 and the amplifiers 235 and 236 are shown as separate blocks, in one aspect the electronic circuit components for these may be combined for one or more drivers, in order to provide for a more efficient digital to analog conversion and amplification operation of the individual driver signals, e.g., using for example class D amplifier technologies.

The system logic board 202 may be the loudspeaker cabinet's main circuit board that includes the rendering processor 205 that may perform several different computational processes, as later described. Although shown in this figure to only include the rendering processor, in one aspect, the system logic board 202 may also include at least some other electronic components e.g., such as the DACs 230 and 231, audio amplifiers 235, 236. In another aspect, the system logic board 202 may also include electronic components not shown in this figure (e.g., logic circuits, memory), and/or interface with components external to the board 202, e.g., light emitting diodes (LEDs) and a display screen.

The individual digital audio driver signal for each of the drivers 125, 115 is delivered through the audio communication link 245, from a rendering processor 205. In this case, since the rendering processor 205 is implemented on the system logic board 202, within the loudspeaker cabinet 110, the audio communication link 245 is a wired connection such as any combination of on-chip and chip-to-chip or electro-optical interconnects. If however the rendering processor 205 is implemented within a separate enclosure from the loudspeaker cabinet 110 (e.g., as part of an audio receiver as previously described in FIG. 1), the audio communication link 245 is more likely to be a wireless digital communication link, such as a BLUETOOTH link or a wireless local area network link. In other instances however, the audio communication link 245 may be over a physical cable, such as a digital optical audio cable (e.g., a TOSLINK connection), or a high-definition multi-media interface (HDMI) cable.

The power supply 220 may convert an input, AC mains 201 (e.g., 110/220 Volts AC) or other input power, e.g., automotive starter battery of 12 Volts DC, or high voltage DC from a propulsion battery, into DC power (e.g., less than 60 Volts DC) for supplying the components of the system 100, e.g., the logic board 202, and audio amplifiers 235, 236. The power supply 220 may provide or deliver power to its load (the electronic components of the system) through multiple, voltage rails. For example, the power supply 220 may provide or deliver power to audio amplifier 235 through a first voltage rail 250; and the power supply 220 may also provide power to the logic board 202 and each of the audio amplifiers 236, through a second voltage rail 255. The first voltage rail 250 may have a higher output power rating than the second voltage rail 255. Although shown as being provided power through the second voltage rail 255, in one aspect, the logic board 202 may be provided power through a different voltage rail. Other electronic components (not shown) may also be provided power by the power supply 220, as part of the total load on the power supply 220.

In one aspect, the power supply 220 is configured to provide a constant output power to its load. For example, the power supply 220 may have a constant output power rating of 100 Watts. This means that the power supply 220 automatically regulates its output voltage V at a maximum value and with a certain current limit, but when the output current I (the load) exceeds the current limit, the output voltage droops. However, the power supply 220 will respond to this voltage droop by entering a power-limited mode in which it increases its current limit as it detects that its output voltage is dropping such that its output power V*I stays constant, at 100 Watts in this example. Thus, while the audio amplifiers 235, 236 are driving their respective loudspeaker drivers to output audio content, such as music, there are instances of elevated sound pressure levels that cause the power supply 220 to enter into this power-limited mode. This is in contrast to a regulated output voltage DC power supply that maintains a constant output voltage, despite changes in its output current.

Storage capacitors 240 are energy reservoirs, designed for supplying the load with bursts of energy, for short amounts of time. These bursts of energy provide the elements that make up the power supply load with more power than can be provided by the power supply 220 itself. In other words, the power supply is assisted by the storage capacitors 240 that are at the output of the power supply 220. For example, a music signal may have a crest factor of at least four (4), or a peak-to-average power ratio of at least sixteen (16). In one aspect, a "peak" in an audio signal, as the term is used here, may be defined as that portion (e.g., sample) of the audio signal that results in an amplifier power consumption level (during its playback) that is at least twice the average power amplifier level during playback of the entire audio program. During periods in which high peak power is required by the load, the storage capacitors 240, which have little internal resistance can discharge their stored energy quickly, thereby providing the load (audio amplifier) with sufficient power to output the audio signal at the peak power level. For example, energy stored in a capacitor may be written as:

$$\text{Energy} = \frac{1}{2}CV^2$$

where C is the capacitance of the capacitor, and V is the voltage across the capacitor. The amount of energy discharged by the capacitor is thus proportional to the square of a decrease in voltage across the capacitor, or in other words, $$\text{Discharged Energy} = \frac{1}{2}C(Vi^2 - Vf^2)$$

where Vi is a previous voltage outputted by the power supply and Vf is a current voltage being outputted by the power supply. Thus, continuing with the previous example, during the times in which the audio amplifier 235 requires additional power to amplify an audio signal (e.g., because a portion of the audio signal has a large amplitude due to for example a bass drum hit), the storage capacitors 240 may be relied upon to provide this additional power; the power supply then responds by charging the storage capacitors back up to the previous voltage, at its constant output power level.

In one aspect, since the characteristics of the power supply 220 and the storage capacitors 240 are known, the system is capable of determining a power budget for certain electronic elements within the system during certain modes of operation, as described above. A power budget may be defined as an available amount of power that the power supply 220 may provide to one or more of its load elements, under operational conditions. In the case of the loudspeaker amplification system 100, the power budget may be the amount of power available for the audio amplifier 235 to drive the loudspeaker driver 115, to output an audio signal. In one aspect, this "available" power may be the difference between i) the constant output power rating of the power supply and ii) the total power required (or expected to be drawn by) all load elements within the system, other than the audio amplifier 235. For example, the load elements may include the system logical board, LEDs and/or a display screen, and audio amplifiers such as full range audio power amplifiers 236 that do not normally exhibit high power peaks, in addition to the low range audio power amplifier 235 that is expected to have high peak power demands. Knowing a power budget for the audio amplifier 235 allows the system to adjust that element's functionality in order to ensure that the element does not draw more power than is currently available. More about power budgets is described below in connection with FIGS. 3-5.

Managing the power requirements of elements within the system 100 based on a power budget as described here may provide several advantages. For instance, this ensures that the power supply 220 and/or storage capacitors 240 are not being overdrawn by the system's elements. Furthermore, unlike other systems that would require a bulky, overdesigned, regulated DC voltage power supply to actually produce the peak power requirements, which take up a significant amount of internal space, the loudspeaker amplification system 100 is able to accommodate such requirements with a more compact, constant output power rating, power supply 220, in combination with the storage capacitors 240. Thus, the loudspeaker amplification system 100 can provide enough power to satisfy the requirements of system elements, with a smaller sized power supply 220 (and capacitors 240) that fit within the loudspeaker cabinet 110, e.g., one having a diameter of less than six inches and a height of less than seven inches.

Continuing with FIG. 2, the system 100 has a rendering processor 205 that is receiving one or more input audio channels or audio signals, of a piece of sound program content from an input audio source 225. The input audio source 225 may provide a digital input (audio signal) or an analog input (audio signal.) The input audio source 225 may include a programmed processor that is running a media player application program and may include a decoder that is producing digital audio for the rendering processor 205, e.g., in a stereo left and right, in a 5.1-surround format, or other available format. The decoder may be capable of decoding an encoded audio signal, which has been encoded using any suitable audio codec, e.g., Advanced Audio Coding (AAC), MPEG Audio Layer II, MPEG Audio Layer III, and Free Lossless Audio Codec (FLAC). Alternatively, the input audio source may include a codec that is converting an analog or optical audio signal, from a line input, for example, into digital form for the rendering processor.

In one aspect, the rendering processor 205 includes an audio signal processing block 210 and a peak power mitigation block 215. The audio signal processing block 210 may modify (or adjust) the digital audio signals received from the input audio source 225 for instance to perform spectral shaping or dynamic range control, create a downmix from multiple channels in the audio signal, adjust gain of an audio signal according to a user-set volume level, or other digital signal processing, to produce one or more loudspeaker driver signals. In one aspect, the processing block may include a beamformer that is configured to produce individual loudspeaker driver input signals for the drivers 125 so as to "render" the audio content of the input audio as multiple, simultaneous desired beams emitted by the drivers 125, operating as a beamforming loudspeaker array.

The peak power mitigation block 215 is to receive a processed audio signal (loudspeaker driver input signal, also referred to as an audio driver signal, or simply audio signal) from the audio signal processing block 210, and adjusts the gain of that signal as needed to mitigate the peak power requirements of the audio content within the audio signal. The gain-adjusted audio signal (gain adjusted loudspeaker driver input signal) will thus stay within the power budget (as defined above) that is associated with the audio amplifier that will be driving that signal. Any peaks in the audio signal that would result in exceeding the power budget are reduced automatically, by the peak power mitigation block 215. To do so, the power mitigation block 215 determines a gain adjustment signal based on a difference between i) a power requirement for the audio amplifier 235 to amplify the audio driver signal with which it drives the loudspeaker driver 115 and ii) a power budget of the audio amplifier 235. Once determined, the gain adjustment signal is applied to the audio driver signal to produce a gain-adjusted (e.g., attenuated) audio driver signal, such that when the audio amplifier 235 amplifies the gain-adjusted audio driver signal, power drawn by the audio amplifier does not exceed the power budget. More about how the peak power mitigation block 215 mitigates peak power requirements is described in FIGS. 3-5. In one aspect, since the operations performed by the block 215 relate to power, which may be non-linear, at least some of those operations are performed in the time domain, rather than in the frequency domain. In another aspect, at least some of the operations are performed in the frequency domain. In another aspect, at least some of the operations, such as linear operations, may be performed upstream of the audio signal processing block 210. In another aspect, the operations performed in the block 215 are the last or most downstream operations that are performed upon the audio driver signals before the latter are received by the DAC 230 (and/or DACs 231), through the communication link 245.

Note that the term "difference" as used in this document may refer to a comparison that can be ascertained by computing i) a ratio between the two values (e.g., average power in a window divided by the power budget, for example in linear units), or ii) a subtraction between the two values (e.g., average power in a window minus the power budget, for example in units of dB.) Thus, in some cases, a division symbol and a subtraction symbol (such as a summing junction with one of the inputs having a negative sign in front) in the drawings are both examples of computing a difference. In other cases, a division symbol may represent multiplication by a scaling factor. Note also that a format conversion may need to be performed upon a value, before a given operation, but are not shown in the drawings, e.g., conversion between linear units and dB units.

Figure 3:
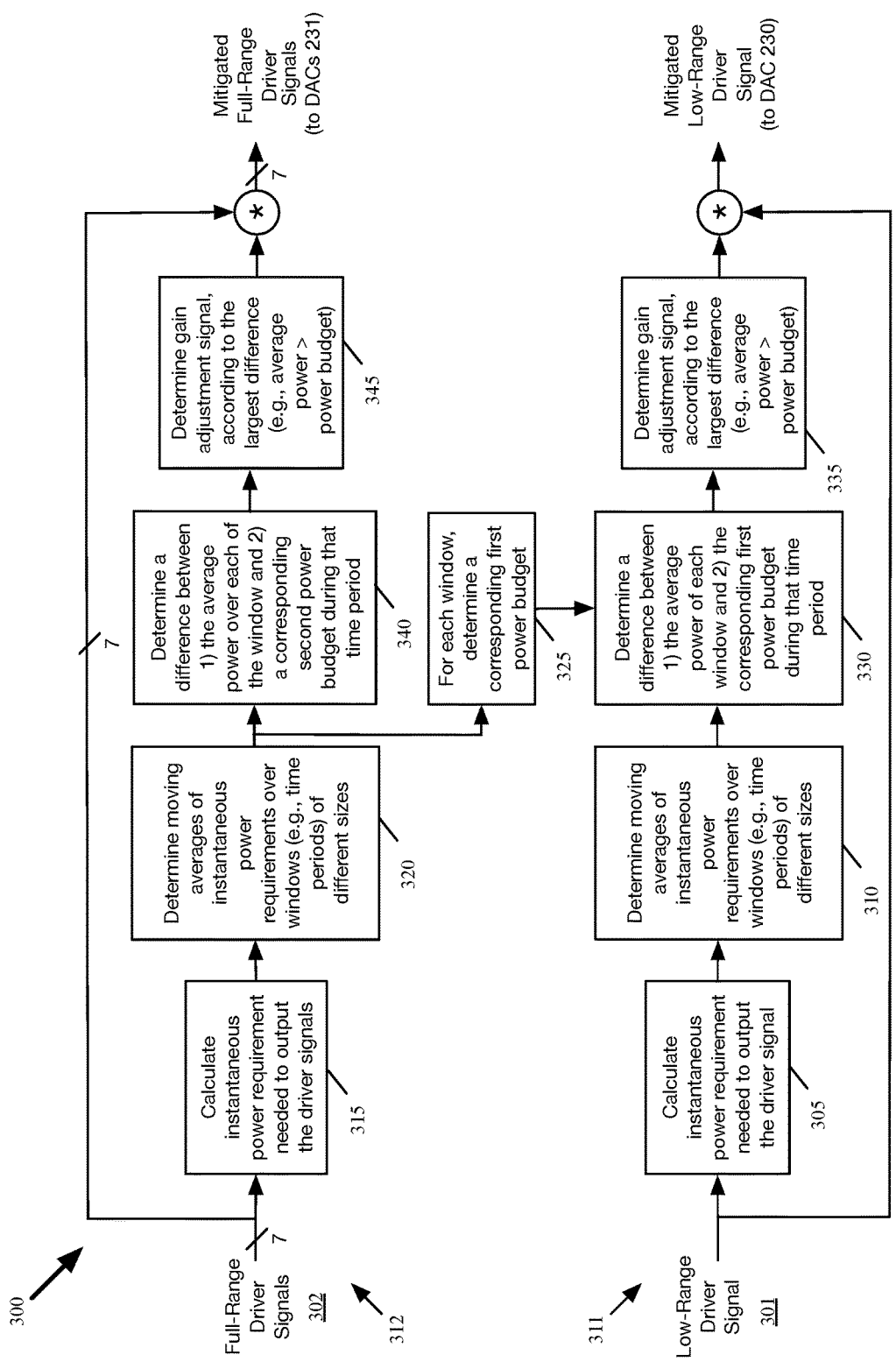
FIG. 3 shows a flow diagram illustrating one aspect of the power mitigation algorithm.

FIG. 3 shows a flow diagram of one aspect of a process 300 of the peak power mitigation algorithm that mitigates peak power requirements of an audio driver signal. The process 300 may be performed by the peak power mitigation block 215. Specifically, this figure shows a low-range driver path 311 that mitigates peak power requirements of a low frequency range or low range driver signal 301, in order to stay within a power budget (e.g., a first power budget.) Also, there is an optional, full-range driver path 312 that mitigates peak power requirements for amplifying several (here, seven, as an example) full frequency range or full range driver signals 302, in order for the full range audio amplifiers 236 to stay within a different (e.g., second) power budget. In one aspect, the low-range driver signal 301 is a signal that has primarily low frequency band audio and not high frequency band audio, while the full-range driver signals 302 are signals that have primarily high frequency band audio, which is higher in frequency than the low frequency band audio of the low-range driver signal 301. In other words, the use of the term "full range" or "full frequency range" in connection with the driver signals 302 does not mean that there is audio that fills the entire audio band.

For each path 311, 312, there is a window of the respective driver signal 301, 302 that is processed as described below to result in a gain adjustment signal that may then be applied to somewhere within that window, at the multiplier block (as shown for each path.) The windows are then moved or slide forward in time (by a certain amount), and the blocks in each path are repeated upon the newly moved windows to result in an update to the gain adjustment signal, and the updated gain adjustment signal is then applied to a newly moved window (at the multiplier block for each path.)

In blocks 305 and 310 of the low-range driver path 311, the mitigation block determines (e.g., calculates or estimates) the power requirement needed to supply the audio amplifier 235 that is driving the loudspeaker driver 115 to output the low-range audio driver signal 301. This may encompass first determining the amount of power that is expected to be drawn (from the power supply 220) by the audio amplifier 235 to output a portion, e.g., one sample, of the low-range audio driver signal 301 through the loudspeaker driver 115. This is also referred to here as an instantaneous power requirement and is done for several portions (samples) in a window or time interval, and for multiple windows (block 305). The multiple windows or time intervals may be said to be overlapping, or overlap each other in time, as explained below using the example in FIG. 4.

Figure 4:
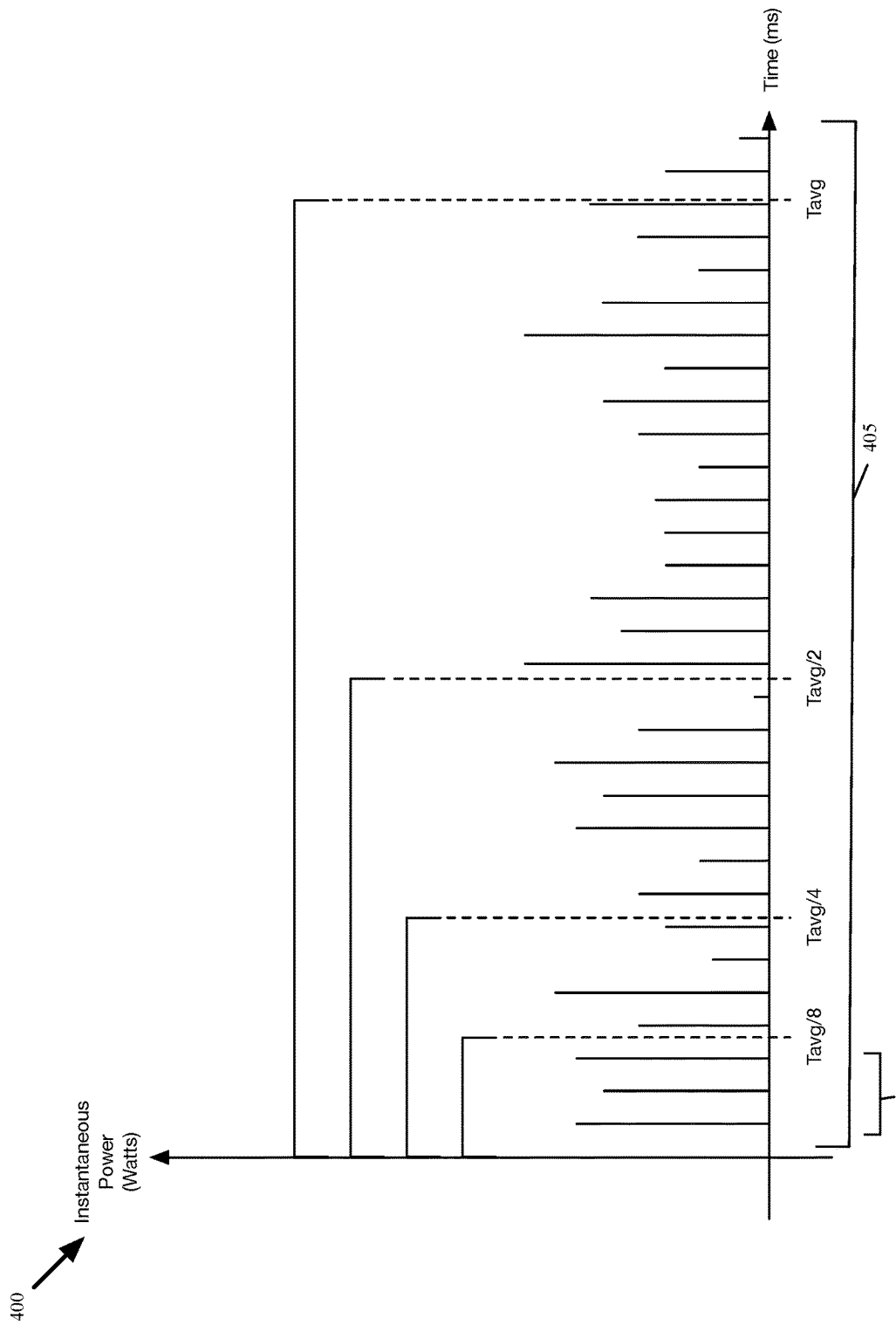
FIG. 4 shows a graph that illustrates the instantaneous power requirements to output an audio signal over time, that are to be averaged over windows of different sizes.

The mitigation block next determines an average of the calculated instantaneous power requirements over each window (at block 310). In one aspect, the several windows may be overlapping, e.g., at least partially overlap each other in time, thereby having at least one instantaneous power requirement in common between at least two windows. Each window represents a different time interval of the audio driver signal. FIG. 4 shows a graph 400 that illustrates an example of the determined, instantaneous power requirements 405 which are to be averaged over several, overlapping windows of different sizes, Tavg/2, Tavg/4, and Tavg/8, each encompassing a different amount of time but all being subsets of a largest window Tavg. The window Tavg is the longest in time of the windows and contains 31 samples; the window Tavg/2 is half as long as the window Tavg and so contains 16 samples; the window Tavg/4 is a quarter of the length of window Tavg; and the window Tavg/8 is an eighth of the length of Tavg. The mitigation block determines the average power for window Tavg/8, by averaging in this example only three instantaneous power requirement values 410 that are within that window. Note that these particular four windows are just examples—the actual number of windows and/or their sizes (number of samples in them) may vary.

Note that the term "average" as used in this document with reference to calculating a power requirement in a window or time interval is used generically, as referring to any suitable measure of central tendency.

Some of the operations described above that are performed in the low range driver signal path 311 to compute a power requirement are repeated by the mitigation block 215 in the full-range driver signal path 312. For example, in block 315, the mitigation block 215 determines (e.g., calculates or estimates), for at least a portion (e.g., a sample, or an audio frame) of each of the full-range audio driver signals 302, the instantaneous power requirement needed to supply a respective loudspeaker driver 125 to output the full-range driver signal during a given time interval. This is similar to the operations described above for block 305. Then, in block 320, the mitigation block 215 determines an average of the calculated instantaneous power requirements (for the full-range driver signals 302) in each of the same windows, as described in block 310, and for example as shown in FIG. 4.

In one aspect, since there are several full-range driver signals 302, the determination of their power requirement in block 315 may be different than in block 305 for the single, low-range driver signal 301. For instance, the mitigation block 215 may calculate an instantaneous power requirement for each of the full-range driver signals 302 and, as there are several full-range driver signals 302, it then combines the calculated instantaneous power requirements into a single, instantaneous total power requirement. This is repeated for several portions (samples) in a window, and for the multiple windows, before determining an average of those instantaneous total power requirements for each window (in block 320.) For example, referring to FIG. 4, when determining the average power for the full-range driver signals 302 over the window Tavg/8, each of the spikes that are shown in FIG. 4 within the window Tavg/8 is actually a power value that is a combination (e.g., sum) of the instantaneous power requirements of the several full-range audio driver signals 302.

At block 325 the mitigation block 215 determines, for each window, a corresponding, first power budget that is to be used in the low range path 311. In one aspect, the system determines the first power budget (for each window) as a difference between a constant output power rating of the power supply 220 and the amount of power expected to be drawn by the system elements (in that window) other than the low range audio power amplifier 235. For example, a first power budget for window Tavg may be the difference between the constant output power rating and the determined average of the instantaneous total power requirements in the window Tavg, which each of the instantaneous total power requirements is the sum of the power requirements of all of the full-range audio driver signals 302 (at a given sample.) In other words, it is an amount of available power left from the power supply 220 after deducting the power requirements of the full range audio amplifiers 236 that output the full-range driver signals 302. In one aspect, the first power budget may also take into account or reflect a further reduction, due to the power requirements of other elements within the system that complete the load on the power supply (e.g., the logic board 202, LEDs, and/or a display screen).

Next, in block 330 the mitigation block 215 determines for each window a difference between i) the average power in the window as determined at block 310 and ii) the window's corresponding first power budget as determined in block 325. In the example of FIG. 4, four such differences are computed that correspond to the four windows Tavg, Tavg/2, Tavg/4 and Tavg/8, respectively.

Next, in block 335, the mitigation block 215 determines (e.g., chooses) a first gain adjustment signal, according to the largest one of the four differences (largest determined difference.) The low-range driver signal 301 is then multiplied by the gain adjustment signal, producing a gain-adjusted (e.g., mitigated) driver audio signal. Specifically, the magnitude or gain in a particular time interval of the driver signal is adjusted according to the gain adjustment signal to produce the gain-adjusted audio signal, and therefore, any peaks in that particular time interval of the low range driver signal 301 that would have resulted in exceeding the power budget are thus automatically reduced in the gain-adjusted driver audio signal, which is then outputted through the loudspeaker driver 115. In one aspect, by selecting the largest difference from amongst the four windows and applying the resulting gain adjustment signal to all of the windows, the algorithm ensures that the low range audio amplifier stays within its power budget during all of the windows.

In one aspect, the gain adjustment signal is multiplied by the low range driver signal 301 in the time domain. Once multiplied, the gain-adjusted driver signal is then directly outputted to the power amplifier 235 through the loudspeaker driver 115, thus, making the mitigation algorithm and gain adjustment performed on the low range driver signal 301 the last digital signal processing operation prior to being output through the loudspeaker driver 115. In one aspect, the gain adjustment signal is multiplied only with a portion of the low range driver signal 301 that corresponds to the window that resulted in the largest difference between average power and the first power budget. For example, if the window Tavg8 produced the largest difference, then only window Tavg is multiplied by the gain adjustment signal. In another aspect, the largest window of which all others are subset, e.g., Tavg in the example here, is multiplied by the gain adjustment signal.

Returning to the full-range driver path 312, in blocks 340, 345 the mitigation block may perform similar operations as those described in above for blocks 330, 335. For example, in block 340, the mitigation block 215 determines for each window a difference between i) the average power needed to output all of the full-range driver signals 302 in that window and ii) a corresponding, second power budget available during that window. Unlike the first power budget, which takes into account the average power required to output all of the full-range driver signals 302 and which may vary per moving window, the second power budget may be a predetermined and fixed amount of power that is "reserved" for the full-range audio power amplifiers 236. Next, in block 345, the mitigation block 215 determines a second gain adjustment signal, according to the largest of determined differences from block 340. The second gain adjustment signal may then be multiplied by a selected window of each of the full-range driver signals 302, to adjust gain of each of the driver signals. Each gain-adjusted driver signal is then sent to its respective audio amplifier 236 to drive a respective loudspeaker driver 125 (see FIG. 2.)

In one aspect, the second gain adjustment signal is applied unchanged to each full-range driver signal 302, but only to the range of frequencies that are actually used to drive the respective loudspeaker driver 125. In another aspect, the gain adjustment signal may be applied differently (e.g., a selected frequency range vs. or all available frequency ranges) to selected ones of the full-range driver signals 302, based on the effectiveness of each driver signals' respective loudspeaker driver 125.

In one aspect, the second gain adjustment signal is multiplied only by the window that resulted in the largest difference between average power and the second power budget of the full-range driver signals that corresponds to the same time period of the largest window. In one aspect, the second gain adjustment signal is multiplied only with a portion of the full range driver signals 302 that corresponds to the window that resulted in the largest difference between average power and the second power budget. For example, if the window Tavg8 produced the largest difference, then only window Tavg is multiplied by the second gain adjustment signal. In another aspect, the largest window of which all others are subset, e.g., Tavg in the example here, is multiplied by the second gain adjustment signal.

Figure 5:
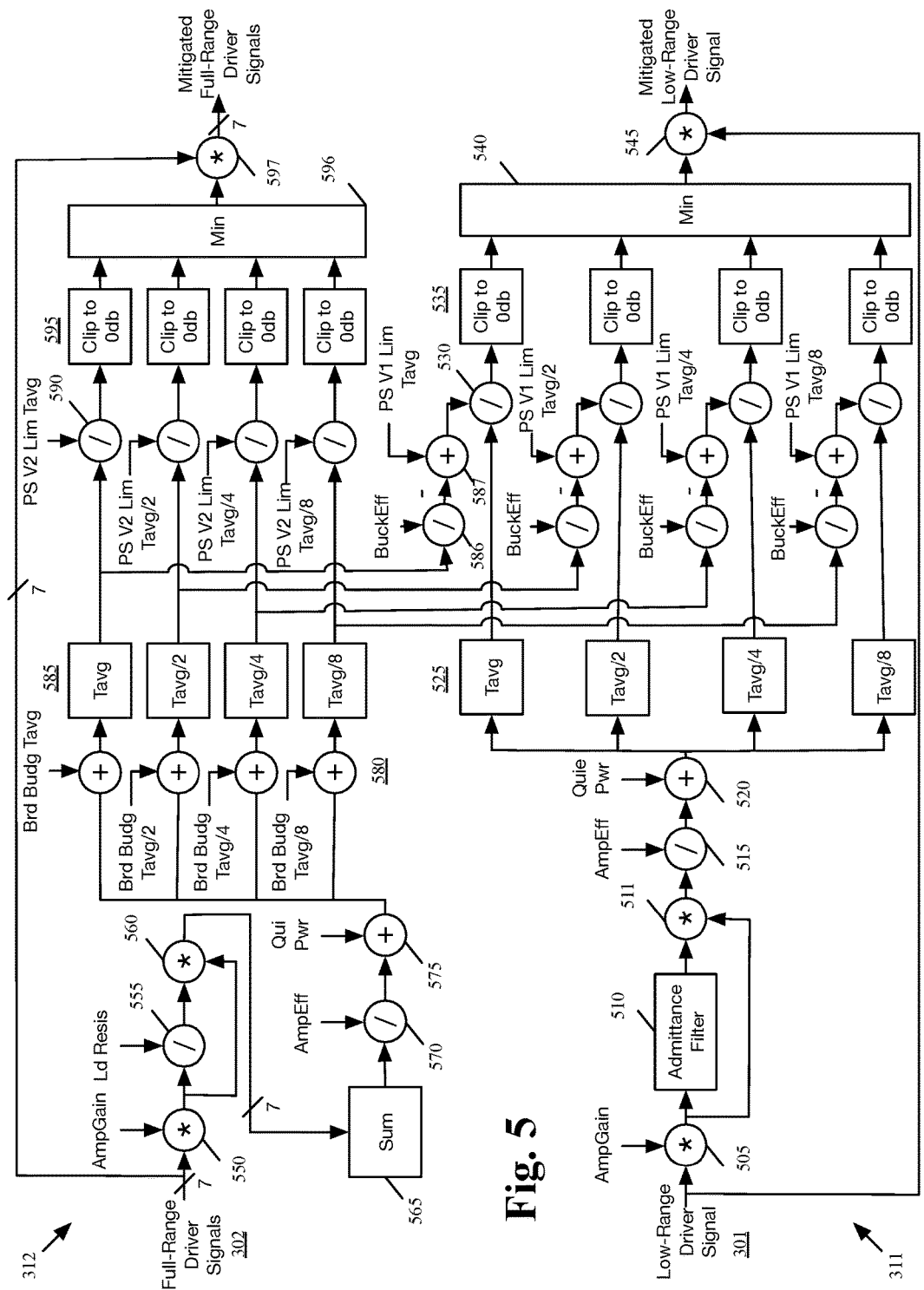
FIG. 5 shows an example of the process flow illustrated in FIG. 3 and in greater detail.

FIG. 5 shows an example of the peak power mitigation algorithm of FIG. 3 having the low-range driver path 311 and the full-range driver path 312. In one aspect, the low-range audio driver signal 301 that is received at the multiplier block 505 may have been decimated (or downsampled) to reduce the sampling rate of the signal, for purposes of complexity reduction. Starting with block 505 of the low range driver path 311, each sample of the decimated signal is multiplied by a known, pre-determined gain, AmpGain, of the audio amplifier 235 to produce a "gain increased" magnitude of the decimated signal, which is an example of an audio driver input signal in the voltage domain, or simply an audio driver input voltage signal. In other words, the result of this multiplication operation is the (estimated) output voltage of the audio amplifier 235, if it were to amplify the portion of the decimated signal for output by the loudspeaker driver 115. Next, an admittance filter 510 receives the gain increased magnitude samples (representing voltage, V, samples) to produce current I samples (also referred to here as the audio driver instantaneous current signal, or a "current response", representing the input current of the loudspeaker driver 115.) A finite impulse response filter may be used as the admittance filter 510 to model the loudspeaker driver 115. To more accurately model the loudspeaker driver 115, the admittance filter 510 is configured by selecting its filter coefficients from those that have been stored in a lookup table in memory, based on a back volume temperature reading of the loudspeaker driver 115 (not shown.) The resulting current response also represents the current drawn from the power supply to drive the loudspeaker driver 115 to output the portion of the decimated signal.

At block 511, the current response from the admittance filter 510 is then multiplied by the output voltage from block 505. Since Power=Current*Voltage, the result of this multiplication is the instantaneous power requirement that is needed to drive the loudspeaker driver 115 to output that portion (sample) of the audio signal. This power value, however, may not be an accurate value, since it does not take into account other variables (e.g., the efficiency of the audio amplifier 235.) Thus, the instantaneous power requirement is divided by a pre-defined amplifier efficiency value, AmpEff (at block 515). In addition, to account for quiescent power required by the audio amplifier 235 to perform its operations, a power quiescent power value, Quie Pwr, is added to the efficiency-adjusted instantaneous power (at block 520). The result is a more accurate estimate of the instantaneous power requirement that is needed by the audio amplifier 235 to drive the loudspeaker driver 115 to output this portion of the audio signal, as an example of the more general description given above in connection with block 305 of FIG. 3.

Staying with FIG. 5, the mitigation algorithm provides several calculated instantaneous power requirements that cover the predefined windows or time intervals, e.g., the four windows Tavg, Tavg/2, Tavg/4, and Tavg/8, of the low-range audio driver signal 301 in several parallel processing paths, each corresponding to a respective, different sized window (e.g., Tavg, Tavg/2, Tavg/4, and Tavg/8). For each of the paths, an average of the calculated instantaneous power requirements over its respective window is determined (blocks 525), as also described more generally in connection with FIG. 3 and FIG. 4 above. Next, at blocks 530, the algorithm determines a difference between the average power over each window and a first power budget that corresponds to the window, as described in block 330 of FIG. 3. More about how the first power budgets are determined from the full range path 312 is also described later. In this example, the determined difference is a ratio (e.g., a division) between the average power and its respective first power budget value, but could alternatively be a subtraction (e.g., in dB domain.) In one aspect, the square root of each of these differences may then be taken (not shown in FIG. 5) to return to voltage domain, since power normally changes as a square of the voltage applied on an electrical load (e.g., a loudspeaker driver.) At blocks 535, the algorithm clips or limits each of the differences (after the square root operation) to be no higher than 0 dB, consistent with a power mitigation algorithm that either allows the audio signal to pass through unchanged (0 dB gain adjustment) or attenuates (a negative dB gain adjustment). In other words, the mitigation algorithm does not boost the audio signal, when the average power is less than the first power budget.

Next, in block 540, the gain adjustment signal is determined, according to the largest difference, as also described above in connection with block 335 of FIG. 3. Here, the least negative dB value, of the four dB values that are provided by the block 535, is selected to be the gain adjustment signal. This signal is then multiplied (block 545) by a selected window of the low-range driver signal 301, and then sent to the audio amplifier 235 for driving loudspeaker driver 115. Thus, the system applies the gain adjustment signal, which is being updated sequentially for each portion or window of the low range driver signal 301, to that portion or window of the driver signal 301, thereby ensuring that the audio amplifier 235 does not overdraw power from the power supply, while driving the loudspeaker driver 115 to output the audio signal.

In one aspect, the gain adjustment signal is multiplied only by the portion of the low-range driver signal 301 that corresponds with the window having the largest difference (from which the gain adjustment signal was determined.) For example, if the algorithm determines the gain adjustment signal from the difference associated with window Tavg/2 (the difference between the average power and the first power budget over window Tavg/2 was the largest of the four windows), then only the portion of the low-range driver signal 301 that extends over window Tavg/2 is multiplied by the gain adjustment signal.

In one aspect, the gain adjustment signal may be modified before being multiplied by the driver signal 301 at block 545. For example, if the gain adjustment signal represents a decimated version of the low-range driver signal 301 as in the example of FIG. 5, the gain adjustment signal may be upsampled back up to the sample rate of the driver signal 301. In one aspect, the gain adjustment signal may also be smoothed through a lowpass filter to remove high-frequency noise, before being multiplied by the driver signal 301.

Still referring to FIG. 5, the power mitigation algorithm may compute the first power budget dynamically, in that the first power budget is updated for each sequential window in which the low-range driver signal is gain-adjusted by the multiplier block 545. To do so, the mitigation algorithm pay perform part of the full-range driver path 312 in blocks 550-585 to compute the average instantaneous power requirement of the full range audio amplifiers 236 in each window, similar to what the algorithm does for the low range audio amplifier 235 (in the low range driver path 311 as described above.) In one aspect, the following operations are performed on portions of the full-range driver signals 302 that correspond, in the sense of time, to the same portion (e.g., the sample) of the low-range driver signal 301 that is processed along the low-range driver path 311, especially since the full-range driver signals 302 may be received or generated from the audio signal processing block 210 in synch with the low range driver signal 301 (see FIG. 2).

Starting with block 550, a portion (e.g., one sample) of each of the full-range driver signals is multiplied by a pre-determined gain, AmpGain, of its respective audio amplifier 236, which drives a respective loudspeaker driver 125 to output the full-range driver signal, to produce a gain increased magnitude or voltage, V, signal. This voltage signal (of each full-range driver signal) is then divided by a load resistance value, Ld Resis, that corresponds to the resistance of its respective loudspeaker driver 125, to produce a current, I, signal value (at block 555). The current signal value is then multiplied by the voltage, V, signal pursuant to the relationship, Power=I*V, to produce the instantaneous power requirement that that is needed by the respective audio amplifier 236 to drive the respective loudspeaker driver 125 to output the full-range driver signal (at block 560). These determined instantaneous power requirements for several loudspeaker drivers 125 are then combined (e.g., summed or added) together at block 565, into a single, total instantaneous power. To improve accuracy, this total instantaneous power value is scaled, divided by a predefined amplifier efficiency value, AmpEff (at block 570). Next, the quiescent power required by each of the audio amplifiers 236, Qui Pwr, is added to the efficiency-adjusted total instantaneous power value (at block 575). The result is a value that represents an accurate calculation of the total instantaneous power required by the audio amplifiers 236 to drive their respective loudspeaker drivers 125 to output one sample each of the several, full-range driver signals 302, as more generally described in block 315 of FIG. 3.

Operation continues with blocks 580 where several separate parallel processing paths are formed, each for one of several different windows, in which the total instantaneous power of the full range audio amplifiers 236 is computed for several sequential samples in a respective window (as described above.) In each path, a power value, Brd Budg Tav, is added that represents the power requirements of other system load elements (e.g., the system logical board 202 and/or other elements, such as LEDs) that draw power from or that complete the load on the power supply 220. These other system load elements may be powered by the same voltage rail, here, the second voltage rail 255 as shown in FIG. 2, as the full range audio amplifiers 236. In one aspect, the other power value that is added in each parallel path of the block 580 (representing for example the power consumption of the logic board and elements other than audio amplifiers) is the same regardless of the size of the respective window of that path. Alternatively, the other power values may vary based on the size of the window, to provide finer granularity or improved accuracy in the computation of the first power budget. In blocks 585, an average of the resulting total instantaneous power values in each of the windows is then determined, as described more generally above in relation to block 320 of FIG. 3. The outputs of the blocks 585 thus include the power consumption of the full range amplifiers 236 (and optionally here, the power consumption of the other system load elements that share the power supply voltage rail 255) in the respective the windows, and are updated in sequential windows, thus enabling the determination of a dynamic, first power budget by block 587 of the low-range driver path 311.

In each of blocks 586, the output of a respective block 585 is subtracted from a constant output power rating of the power supply 220 on the voltage rail 250, or power supply limit, PS V1 Lim, at a respective block 587, to result in the first power budget in the respective window. These first power budget values (computed for on a per window basis) are then provided to the blocks 530 which as described above determine the difference between the average power and the first power budget for each window, leading eventually to block 545 where the gain adjustment process results in a mitigated, low-range driver signal.

Note that blocks 586 are optional and may be added to account for the less than 100% efficiency of a power converter, e.g., a buck converter, that is used to produce the power supply output voltage on the voltage rail 255 which may be different than what the low range amplifiers 235 use for their power supply, namely the voltage rail 250. Therefore, the computed power at the output of each block 585, for each window, is divided by an optional, pre-defined power converter efficiency value, BuckEff, that may vary for each window.

There is also an optional gain adjustment process that can be performed upon the full-range driver signals 302, to produce the mitigated full-range driver signals in FIG. 5. These may proceed in the full-range driver path 312 beginning with blocks 590 and ending with block 597 where a second gain adjustment signal is applied to the full-range driver signals 302. In each of the blocks 590, a difference between i) the determined total power requirement for all of the full range amplifiers 236 (from the respective block 585) and ii) a second power budget is determined. The second power budget may be represented by the power supply limit, PS V2 Lim, which may be the constant output power rating on the second voltage rail 255 (and that may be different for each window.) The result of each division in block 590 is a determined difference between the average total power requirement over a window and the second power budget in that window, as also described above in block 340 of FIG. 3. The algorithm may clip or limit each of the differences in blocks 595, to prevent any boost being applied to the full range driver signals 302, similar to the operations performed at blocks 535 for the low range driver signal 301. At block 596, the algorithm then determines (e.g., selects) a second gain adjustment signal according to the largest difference, as described in block 345 of FIG. 3. This signal is then multiplied by each of the full-range driver signals 302, and then each of these gain adjusted full-range driver signals at block 597, before being sent to its respective audio amplifier 236 for driving a loudspeaker driver 125. In one aspect, this second gain adjustment signal may also be smoothed through a lowpass filter (not shown), before being multiplied by each of the full-range audio driver signals 302 at block 597, to remove high-frequency noise.

In one aspect, since it may take time for the mitigation block 215 to process the two driver paths 311, 312, the low-range and full-range driver signals 301, 302 may be delayed in buffers (not shown) before being multiplied by their respective gain adjustment signals at blocks 545, 597.

In one aspect, the determination of the first power budgets used to mitigate the low-range driver signal 301 (e.g., at block 325, in FIG. 3) are dynamic and are based on "predicted" power requirements, or the power predicted to be needed to output the full-range audio driver signals 302 during the different windows. Thus, the actual power drawn by the full range amplifiers 236 to output the full-range driver signals 302 may be different than even the more accurately estimated average powers that are determined at blocks 585 of FIG. 5. For further accuracy, a feedback path (not shown) may be added. For example, the power requirements determined at blocks 585 may be further adjusted according to the second gain adjustment signal that is multiplied by the full-range driver signals at block 597, through this feedback path. In one aspect, the power requirements may be adjusted before being divided by the buck efficiency value at block 586. In one aspect, to adjust the power requirements, the second gain adjustment signal is multiplied by each of the power requirements that are determined by the blocks 585. There may be a conversion unit needed here to convert the second gain adjustment signal, which may be in voltage domain, into the power domain. Thus, in this scheme, the first power budget that is determined in blocks 587 (for each window) includes the difference between the constant output power rating of the power supply 220, PS V1 Lim (in that window) and the adjusted (e.g., improved accuracy) version of the power requirement (in that window.)

It should be noted that in some aspects, variations of the processes described in FIGS. 2-5 can be performed in which the specific operations are not performed in the exact order shown in the drawings or described above.

As previously explained, an aspect of the invention may be a non-transitory machine-readable medium (such as microelectronic memory) having stored thereon instructions, which program one or more data processing components (generically referred to here as a "processor") to perform the audio signal processing operations and peak power mitigation operations described above. In other aspects, some of these operations might be performed by specific hardware components that contain hardwired logic. Those operations might alternatively be performed by any combination of programmed data processing components and fixed hardwired circuit components.

While certain aspects have been described and shown in the accompanying drawings, it is to be understood that such aspects are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A method for performing a power mitigation algorithm at a loudspeaker amplification system that comprises i) a loudspeaker driver for outputting a first audio signal, ii) a first amplifier, and iii) a power supply that provides power to elements of the loudspeaker amplification system including the first amplifier, the method comprising:
receiving, by a processor, a first audio signal;
computing a power requirement, based on processing the first audio signal, for the first amplifier to drive the loudspeaker driver with the first audio signal;
determining a gain adjustment signal based on a difference between the power requirement and a power budget, wherein the power budget is available power from the power supply for the first amplifier to drive the loudspeaker; and
adjusting a gain of the first audio signal according to the gain adjustment signal, to produce a gain-adjusted first audio signal, wherein the gain-adjusted first audio signal is then output through the loudspeaker driver, and wherein power delivered to the first amplifier during outputting of the gain-adjusted first audio signal is less than the power budget of the first amplifier.

2. The method of claim 1 wherein computing the power requirement comprises processing the first audio signal to determine, for each of a plurality of overlapping time intervals of different sizes, an average of a determined plurality of instantaneous power requirements to supply the first amplifier to output the first audio signal over the overlapping time interval.

3. The method of claim 2 wherein the received first audio signal is an audio driver input signal in voltage domain, the method further comprising determining the plurality of instantaneous power requirements by:
applying a loudspeaker driver admittance filter, which represents input admittance of the loudspeaker driver, to transform the audio driver input signal in the voltage domain into an audio driver instantaneous current signal; and
multiplying the audio driver instantaneous current signal by the audio driver input voltage signal.

4. The method of claim 2, wherein determining the gain adjustment signal comprises
determining, for each of the plurality of overlapping time intervals, a difference between the determined average and the power budget,
wherein the largest determined difference, and not any others of the determined differences, is used to determine the gain adjustment signal.

5. The method of claim 4, wherein the first audio signal comprises audio in a first frequency band,
wherein the loudspeaker amplification system further comprises a plurality of additional loudspeaker drivers, each configured to output audio in a second frequency band that is higher than the first frequency band.

6. The method of claim 1, wherein the first audio signal comprises audio in a first frequency band and the loudspeaker amplification system further comprises a plurality of additional loudspeaker drivers each configured for audio output in a second frequency band that is higher than the first frequency band, and wherein the power budget is a first power budget and the gain adjustment signal is a first gain adjustment signal, the method further comprising:
receiving a plurality of second audio signals, one for each of the plurality of additional loudspeaker drivers;
determining, based on the plurality of second audio signals, a total power requirement for the plurality of second amplifiers to drive the plurality of additional loudspeaker drivers with the plurality of second audio signals;
determining a second gain adjustment signal based on a difference between the total power requirement and a second power budget; and
adjusting a gain of each of the plurality of second audio signals according to the second gain adjustment signal to produce a plurality of gain-adjusted second audio signals with which the additional loudspeaker drivers are driven by the second amplifiers.

7. The method of claim 6 wherein determining the total power requirement comprises:
determining for each of a plurality of overlapping time intervals of different sizes an average of a plurality of determined instantaneous total power requirements, to supply the second amplifiers to output the plurality of second audio signals over the overlapping time interval, and
determining, for each of the plurality of overlapping time intervals, a difference between i) the average of the plurality of determined instantaneous total power requirements and ii) the second power budget,
and wherein determining the second gain adjustment signal is based on the largest difference.

8. The method of claim 1, wherein the first audio signal comprises audio in a first frequency band and the loudspeaker amplification system further comprises a plurality of additional loudspeaker drivers each configured for audio in a second frequency band that is higher than the first frequency band, and wherein the power budget is a first power budget and the gain adjustment signal is a first gain adjustment signal, the method further comprising:
receiving a plurality of second audio signals, one for each of the plurality of additional loudspeaker drivers; and
determining, based on the plurality of second audio signals, a total power requirement for the plurality of second amplifiers to drive the plurality of additional loudspeaker drivers with the plurality of second audio signals, and wherein the first power budget comprises a difference between i) a constant output power rating of the power supply and ii) the total power requirement for the second amplifiers.

9. An article of manufacture comprising a non-transitory machine-readable medium having instructions stored therein that when executed by a processor of an audio amplification system having i) a loudspeaker driver for outputting an audio signal, ii) a first amplifier, and iii) a power supply that provides power to elements of the loudspeaker amplification system including the first amplifier,
receive an audio signal,
compute a power requirement, based on processing the audio signal, for the first amplifier to drive the loudspeaker driver with the audio signal,
determine a gain adjustment signal based on a difference between the power requirement and a power budget, wherein the power budget is available power from the power supply for the first amplifier to drive the loudspeaker, and
adjust gain of the audio signal according to the gain adjustment signal, to produce a gain-adjusted audio signal that is to be output through the loudspeaker driver.

10. The article of manufacture of claim 9 wherein the received audio signal is an audio driver input voltage signal, and wherein to compute the power requirement the processor is to:
determine a plurality of instantaneous power requirements by applying a loudspeaker driver admittance filter, which represents input admittance of the loudspeaker driver, to transform the audio driver input voltage signal into an audio driver instantaneous current signal, and
multiply the audio driver instantaneous current signal by the audio driver input voltage signal.

11. The article of manufacture of claim 9, wherein to determine the power requirement, the processor is to:
determine, for each of a plurality of overlapping time intervals of different sizes, an average of a plurality of determined instantaneous power requirements to supply the first amplifier to output the audio signal over the overlapping time interval.

12. The article of manufacture of claim 11, wherein to determine the gain adjustment signal, the processor is to:
determine, for each of the plurality of overlapping time intervals, a difference between the determined average and the power budget,
wherein the largest determined difference, and not any other of the determined differences, is used to determine the gain adjustment signal.

13. The article of manufacture of claim 12, wherein the gain-adjusted audio signal comprises audio in a first frequency band,
wherein the loudspeaker amplification system further comprises a plurality of additional loudspeaker drivers each configured for audio output in a second frequency band that is higher than the first frequency band.

14. The article of manufacture of claim 9, wherein the audio signal comprises audio in a first frequency band, and the loudspeaker amplification system further comprises a plurality of additional loudspeaker drivers each configured for audio output that is in a second frequency band that is higher than the first frequency band, and wherein the power budget is a first power budget and the gain adjustment signal is a first gain adjustment signal, and the processor is to:
receive a plurality of second audio signals, one for each of the plurality of additional loudspeaker drivers,
determine, based on the plurality of second audio signals, a total power requirement for the plurality of second amplifiers to drive the plurality of additional loudspeaker drivers with the plurality of second audio signals,
determine a second gain adjustment signal based on a difference between the total power requirement and a second power budget, and
adjust a gain of each of the plurality of second audio signals according to the second gain adjustment signal to produce a plurality of gain-adjusted second audio signals with which the additional loudspeaker drivers are driven by the second amplifiers.

15. The article of manufacture of claim 9, wherein to determine the total power requirement the processor is to:
determine for each of a plurality of overlapping time intervals of different sizes an average of a plurality of determined instantaneous total power requirements, to supply the second amplifiers to output the plurality of second audio signals over the overlapping time interval, and
determine, for each of the plurality of overlapping time intervals, a difference between i) the average of the plurality of determined instantaneous total power requirements and ii) the second power budget,
and wherein the second gain adjustment signal is determined based on the largest difference.

16. The article of manufacture of claim 9, wherein the audio signal comprises audio in a first frequency band and the loudspeaker amplification system further comprises a plurality of additional loudspeaker drivers each capable of audio output that comprises audio in a second frequency band that is higher than the first frequency band, and wherein the power budget is a first power budget and the gain adjustment signal is a first gain adjustment signal, and wherein the processor is to:
receive a plurality of second audio signals, one for each of the plurality of additional loudspeaker drivers, and
determine, based on the plurality of second audio signals, a total power requirement for the plurality of second amplifiers to drive the plurality of additional loudspeaker drivers with the plurality of second audio signals,
and wherein the first power budget comprises a difference between i) a constant output power rating of the power supply and ii) the total power requirement for the second amplifiers.

17. A loudspeaker amplification system comprising a loudspeaker cabinet, having integrated therein:
a first audio amplifier;
a first loudspeaker driver coupled to an output of the first audio amplifier;
a constant output power, power supply coupled to a power supply input of the first audio amplifier;
a processor; and
memory having stored therein instructions that when executed by the processor:
receive a first audio signal,
compute a first power requirement needed to enable the first audio amplifier to drive the first loudspeaker driver with the first audio signal by processing the first audio signal,
determine a first gain adjustment signal based on a difference between the first power requirement and a first power budget, wherein the first power budget is available power from the power supply for the first audio amplifier to drive the loudspeaker, and adjust a gain of the first audio signal according to the first gain adjustment signal, to produce a gain-adjusted first audio signal, wherein the gain-adjusted first audio signal is to then be output through the first loudspeaker driver.

18. The loudspeaker amplification system of claim 17, wherein the machine-readable medium has further instructions stored therein that when executed by the processor determine, for each of a plurality of overlapping time intervals of different sizes, an average of a plurality of determined instantaneous power requirements to supply the first audio amplifier to output the first audio signal over the overlapping time interval.

19. The loudspeaker amplification system of claim 18, wherein to determine the first gain adjustment signal, the processor is to:

determine, for each of the plurality of overlapping time intervals, a difference between the determined average and the first power budget, and wherein the largest determined difference is used to determine the first gain adjustment signal.

20. The loudspeaker amplification system of claim 19, wherein the gain-adjusted first audio signal comprises audio in a first frequency band and not in a second frequency band that is higher than the first frequency band, and wherein the loudspeaker amplification system further comprises a plurality of additional loudspeaker drivers each configured to output audio in the second frequency band.

21. The loudspeaker amplification system of claim 17, wherein the first audio signal comprises audio in a first frequency band and not a second frequency band which is higher than the first frequency band, and the loudspeaker amplification system further comprises a plurality of second loudspeaker drivers configured for audio output in the second frequency band, and the processor is to:

receive a plurality of second audio signals, one for each of the plurality of second loudspeaker drivers;

determine, based on the plurality of second audio signals, a total power requirement for the plurality of second audio amplifiers to drive the plurality of additional loudspeaker drivers with the plurality of second audio signals, determine a second gain adjustment signal based on a difference between the total power requirement and a second power budget, and adjust a gain of each of the plurality of second audio signals according to the second gain adjustment signal to produce a plurality of gain-adjusted second audio signals with which the additional loudspeaker drivers are driven by the second audio amplifiers.

22. The loudspeaker amplification system of claim 17, wherein the first audio signal comprises audio in a first frequency band and the loudspeaker amplification system further comprises a plurality of additional loudspeaker drivers each capable of audio output that comprises audio in a second frequency band that is higher than the first frequency band, and wherein the power budget is a first power budget and the gain adjustment signal is a first gain adjustment signal, and wherein the processor is to:

receive a plurality of second audio signals, one for each of the plurality of additional loudspeaker drivers, and determine, based on the plurality of second audio signals, a total power requirement for the plurality of second audio amplifiers to drive the plurality of additional loudspeaker drivers with the plurality of second audio signals, and wherein the first power budget comprises a difference between i) a constant output power rating of the power supply and ii) the total power requirement for the second audio amplifiers.

\* \* \* \* \*